United States Patent [19]

Kurosawa et al.

[11] Patent Number: 4,951,175
[45] Date of Patent: Aug. 21, 1990

[54] SEMICONDUCTOR MEMORY DEVICE WITH STACKED CAPACITOR STRUCTURE AND THE MANUFACTURING METHOD THEREOF

[75] Inventors: Kei Kurosawa, Tokyo; Hidehiro Watanabe, Kawasaki; Shizuo Sawada, Yokohama, all of Japan

[73] Assignee: Kabushiki Kaisha Toshiba, Kawasaki, Japan

[21] Appl. No.: 353,765

[22] Filed: May 18, 1989

[30] Foreign Application Priority Data

May 18, 1988 [JP] Japan .................................. 63-119201
Sep. 5, 1988 [JP] Japan .................................. 63-221620

[51] Int. Cl.$^5$ .................... H01G 4/06; H01L 21/70; H02L 29/78
[52] U.S. Cl. ................................. 361/313; 357/23.6; 437/48
[58] Field of Search ................. 437/20, 47, 48, 52; 365/149; 361/311–313; 357/51, 23.6

[56] References Cited

U.S. PATENT DOCUMENTS

| | | | |
|---|---|---|---|
| 4,271,424 | 6/1981 | Inayoshi et al. | 357/51 X |
| 4,649,406 | 3/1987 | Takemae et al. | 357/51 X |
| 4,683,486 | 7/1987 | Chatterjee | 357/23.6 |
| 4,721,987 | 1/1988 | Baglee et al. | 357/23.6 |
| 4,742,018 | 5/1988 | Kimura et al. | 437/48 |
| 4,761,385 | 8/1988 | Pfiester | 437/52 |
| 4,794,563 | 12/1988 | Maeda | 357/23.6 X |

FOREIGN PATENT DOCUMENTS 0223616 5/1987 European Pat. Off. .
0295709 12/1988 European Pat. Off. .

Primary Examiner—Donald A. Griffin
Attorney, Agent, or Firm—Oblon, Spivak, McClelland, Maier & Neustadt

[57] ABSTRACT

A dynamic random access memory with a stacked capacitor cell structure is disclosed which has a memory cell provided on a silicon substrate and having a MOSFET and a capacitor. An insulative layer is formed on the substrate, and a first polycrystalline silicon layer is formed on this insulative layer. These layers are simultaneously subjected to etching and define a contact hole which penetrates them to come in contact with the surface of the source. A second polycrystalline silicon layer is formed on the first polycrystalline silicon layer to uniformly cover the inner wall of the contact hole and that surface portion of the source which is exposed through the contact hole. The first and second silicon layers are simultaneously subjected to patterning to provide the lower electrode of the capacitor. After a capacitor insulation layer is formed on the second polycrystalline silicon layer, a third polycrystalline silicon layer is formed on the capacitor insulation layer so as to bury a recess of the second polycrystalline silicon layer. The third silicon layer constitutes the upper electrode of the capacitor.

26 Claims, 8 Drawing Sheets

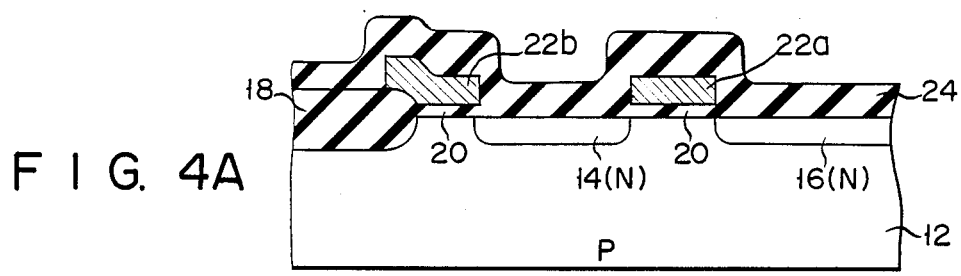
F I G. 4A
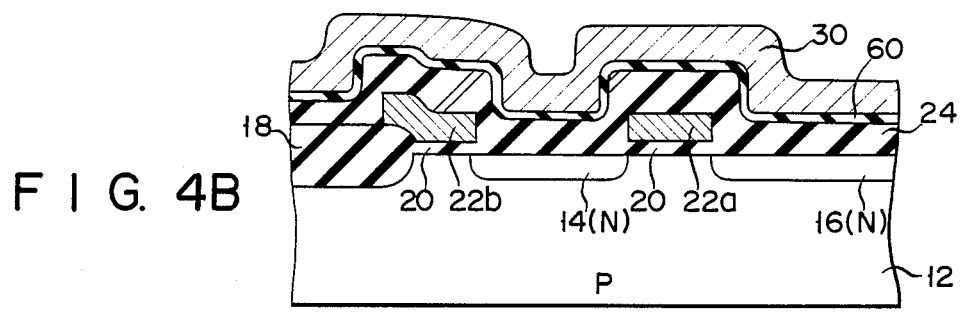
F I G. 4B
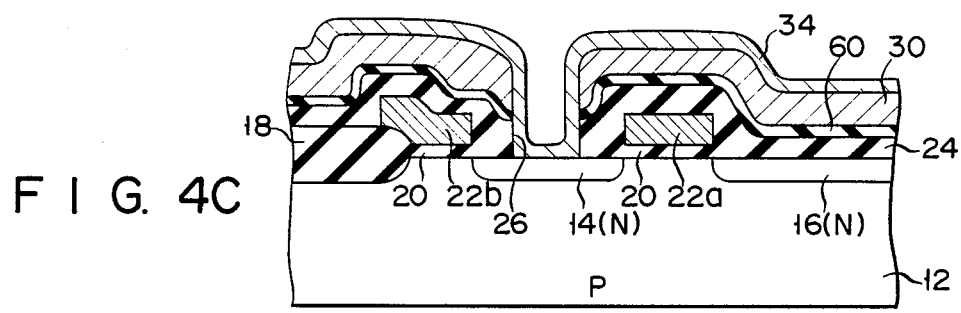
F I G. 4C

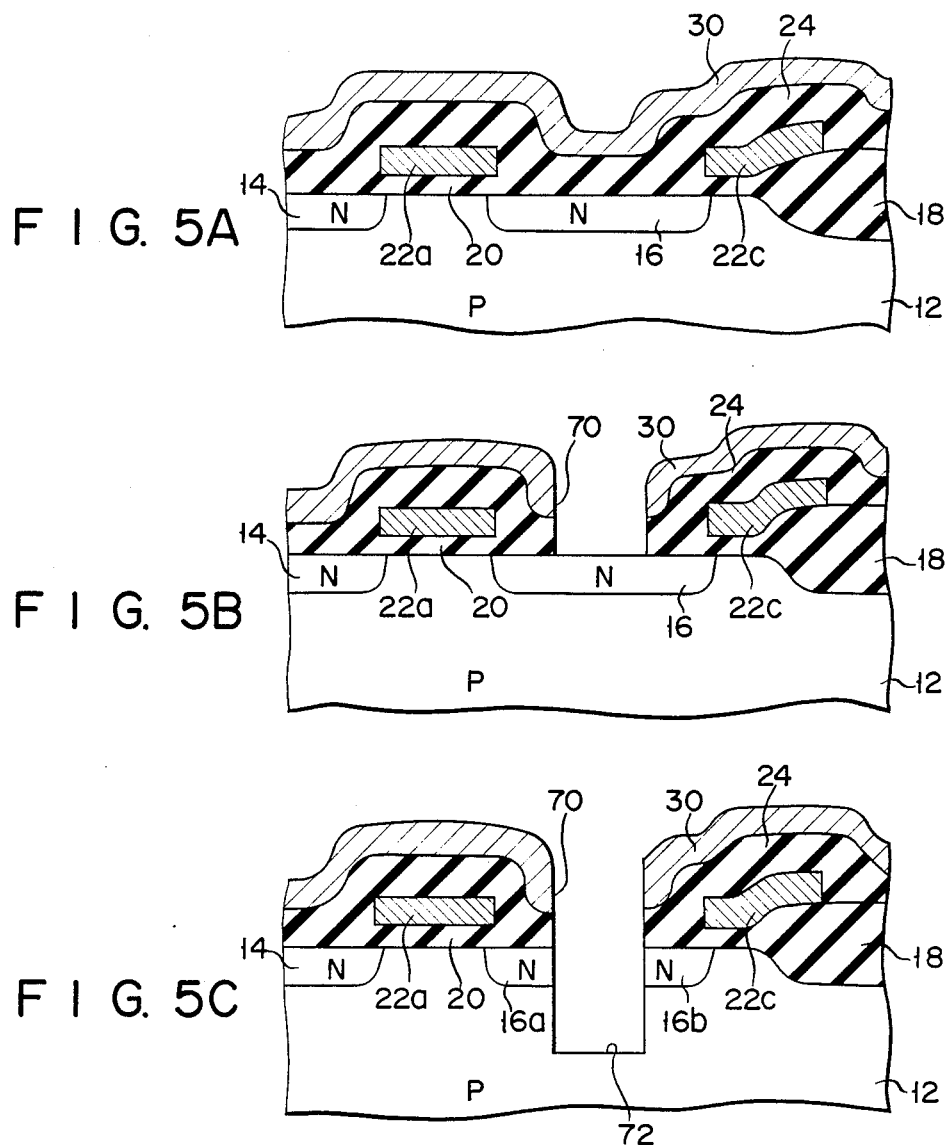
F I G. 5A
F I G. 5B
F I G. 5C ns4,951,175

SEMICONDUCTOR MEMORY DEVICE WITH STACKED CAPACITOR STRUCTURE AND THE MANUFACTURING METHOD THEREOF

BACKGROUND OF THE INVENTION

1. Field of the Invention

The present invention relates to semiconductor memory devices, and, more particularly, to a dynamic random access memory having a stacked capacitor cell structure.

2. Description of the Related Art

With the increasing needs for high performance of digital systems, developments of semiconductor memory devices, particularly, random access memories, continue for higher integration density. With restriction on the size of a chip substrate, if many memory cells, each constituted by one transistor and one capacitor, are simply packed, the occupying area of each memory cell would decrease The reduction of the memory cell size decreases the area of the cell capacitor. This deteriorates the performance of accumulating data charges. For instance, reduction in electrode area of a capacitor decreases the maximum amount of charge accumulatable, thus resulting in malreading of memory contents and increasing the chance of causing data damage by radiation. This impairs the reliability of data accessing accordingly.

Recently, for a dynamic random access memory (hereinafter called "DRAM" according to the practice of the concerned technical field), it becomes popular to employ the "stacked capacitor cell" structure in order to pack a greater number of memory cells on a chip substrate with a limited size without reducing the reliability of data accessing. According to this technique, a capacitor is insulatively disposed above a cell transistor formed on the chip substrate. An insulative layer sandwiched between the transistor and capacitor has a contact hole formed therein. An electrode of the capacitor is electrically coupled via the hole to the diffusion layer of the underlying transistor, which serves as a source or drain thereof.

The integration of DRAMS is generally improved by effectively increasing the effective area of a cell capacitor electrode to thereby increase the capacitance of the capacitor. According to DRAMS with the aforementioned stacked capacitor cell structure, however, higher integration of the DRAMs employing such a technique cannot be expected for the following reasons To increase the effective area of the capacitor electrode without increasing the occupying area of each capacitor on the substrate, a recess should be formed in an insulative layer for electrically separating the transistor from capacitor and the lower electrode layer of the cell capacitor should be formed so as to be stuck to the inner wall of the recess. The higher the integration density of DRAMs, the smaller the area of one cell becomes and, naturally, the narrower the recess gets. With the present state-of-art technology, therefore, it is very difficult to effectively form, within the recess, a capacitor electrode layer, which is expected to be relatively thick to have a thickness greater than a predetermined value. If the electrode layer portions formed on the facing inner walls of the recess come in contact with each other, the entire effective area of the capacitor electrode cannot be increased.

SUMMARY OF THE INVENTION

It is therefore an object of this invention to provide a new and improved semiconductor memory device which has a high integration density and an excellent operation reliability, and a method of manufacturing the same.

In accordance with the above object, the present invention is addressed to a specific semiconductor memory device which has a memory cell with a stacked capacitor cell structure provided on a semiconductive substrate. This memory cell has a transistor and a capacitor. The cell transistor has source and drain layers formed in the substrate and a gate electrode insulatively disposed above the substrate. The cell capacitor is insulatively stacked on the transistor. An insulative layer for electrically separating the transistor from the capacitor is formed on the substrate, then, a first conductive layer is formed on this insulative layer. These layers are simultaneously subjected to an etching process, thereby defining a contact hole which is connected to one of the source and drain layers through those layers. A second conductive layer is formed on the first conductive layer so as to substantially uniformly cover the inner wall of the contact hole and the surface portion of one of the source and drain layers exposed through the contact hole. The second conductive layer has a recess corresponding to the contact hole. The first and second conductive layers are subjected to patterning to thereby constitute a lower electrode of the capacitor. After a capacitor insulative thin film is formed on this lower electrode layer, a third conductive layer is formed on the insulative thin film in such a way as to bury the recess of the second conductive layer. The third conductive layer constitutes an upper electrode of the cell capacitor, thus completing the capacitor.

This invention and its objects and advantages will become more apparent from the following detailed description of preferred embodiments

BRIEF DESCRIPTION OF THE DRAWINGS

In the detailed description of preferred embodiments of the present invention presented below, reference is made to the accompanying drawings in which:

FIGS. 4A to 4D are cross-sectional views illustrating the essential structures attained by the main processes of a DRAM manufacturing method according to another embodiment of the present invention; and FIGS. 5A to 5G are cross-sectional views illustrating the essential structures attained by the main processes of a DRAM manufacturing method according to a further embodiment of the present invention.

DETAILED DESCRIPTION OF THE PREFERRED EMBODIMENT

Figure 1:
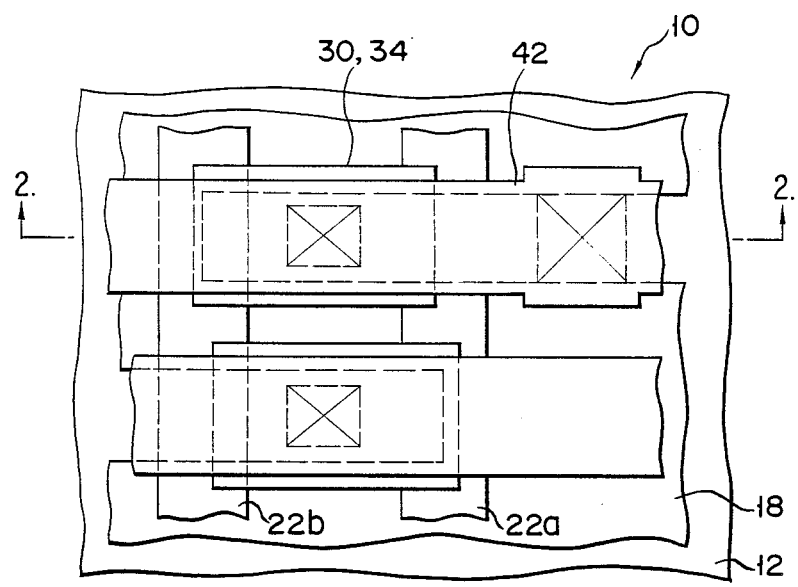
FIG. 1 is a schematic diagram illustrating, in enlargement, the plane structure of the essential portion of a DRAM according to one preferred embodiment of the present invention.
Figure 2:
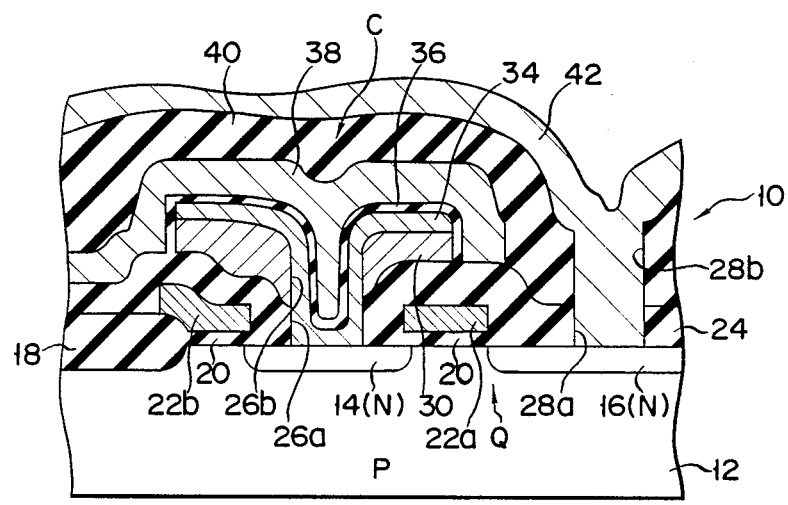
FIG. 2 is a schematic diagram illustrating the cross-sectional structure of the DRAM of FIG. 1 along the line II—II.

Referring to FIGS. 1 and 2, a DRAM according to one preferred embodiment of the present invention is generally designated by reference numeral "10." The DRAM 10 has a silicon substrate 12 with a P type conductivity. As shown in FIG. 2, diffusion layers 14 and 16 with an N type conductivity are formed on that top surface of the substrate 12 which is surrounded by a device separating insulative layer 18 to thereby define one memory cell. These diffusion layers 14 and 16 respectively serve as the source and drain of a metal oxide semiconductor field effect transistor (MOSFET) Q of one memory cell. A gate oxide film 20 is formed on the substrate 12, and a polycrystalline silicon layer 22a serving as the gate of the MOSFET Q is deposited on the film 20. This gate electrode 22a is self-aligned with the source and drain layers 14 and 16. A polycrystalline silicon layer 22b serves as the gate electrode of a neighboring MOSFET.

The MOSFET Q is covered with an insulative layer 24, which may be a $SiO_2$ layer. The insulative layer 24 has openings 26 and 28 on the source and drain layers 14 and 16 of the MOSFET Q. The opening 26 serves as a capacitor groove and a contact hole while the opening 28 serves as a contact hole. A first conductive layer 30 is deposited around an opening 26a of the insulative layer 24. This layer 30, which may be a polycrystalline silicon layer, has an opening 26b formed continuous with the source contact hole 26a. The openings 26a and 26b may be considered substantially as one contact hole because they are simultaneously formed through one etching process, as will be described later. A second conductive layer 34 is formed in such a way as to uniformly cover (or be stuck to) the side walls and bottom of the opening or hole 26 and to be stacked on the first conductive layer 30. This second conductive layer may be a thin polycrystalline silicon layer. As illustrated in FIG. 1, the first and second polycrystalline silicon layers 30 and 34 overlap each other and serve as the lower electrode of a cell capacitor C.

An insulative layer 36 is formed on the lower capacitor electrode 30, 34 so as to have a uniform thickness. This insulative layer 36 is so thin that it holds the recess shape on the source contact hole 26 with a good fidelity. The insulative layer thin film 36 extends to peripheral edge portions of the lower electrode. A third conductive layer 38, relatively thick, is formed so as to cover the insulative thin film 36. The third conductive layer 38, which may also be a polycrystalline silicon layer, buries the interior of the capacitor groove 26, so that the surface of the layer 38 in the groove faces the layer 34 of the lower capacitor electrode stacked structure, at an increased area, through the thin capacitor insulative thin film 36. The cell capacitor C is completed by such a stacked structure. With this structure, the insulative thin film 36 serves as a capacitor insulative layer, and the polycrystalline silicon layer 38 as the upper capacitor electrode.

The capacitor structure is covered with a thick insulative layer 40 having a contact hole 28b formed continuous with the aforementioned drain contact hole 28a. The openings 28a and 28b are substantially a single contact hole. A thin elongated conductive layer 42 shown in FIG. 1 is deposited on the insulative layer 40, and is in electric contact with the drain layer 16 via the drain contact hole 28.

The method for producing the above stacked DRAM cell structure will now be described referring to FIGS. 3A through 3F.

Figure 3A:
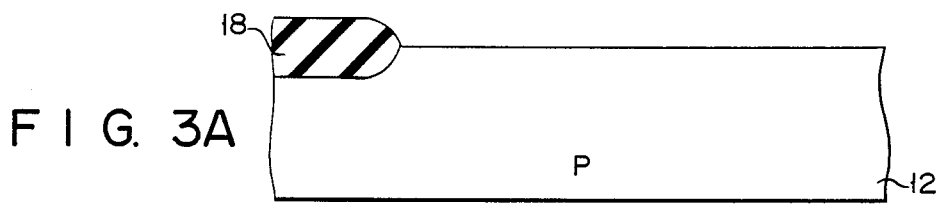
FIGS. 3A to 3F are cross-sectional views illustrating the essential structures attained by main processes of a manufacturing method embodying the present invention to produce the DRAM shown in FIGS. 1 and 2.

In FIG. 3A, there is shown the substrate 12 of P type silicon. The insulative layer 18 constituted by a device separating oxide film is deposited on the substrate 12 by, for example, selective oxidization method. The exposed substrate surface region is a device forming region where forming a DRAM memory cell is permitted.

Figure 3B:
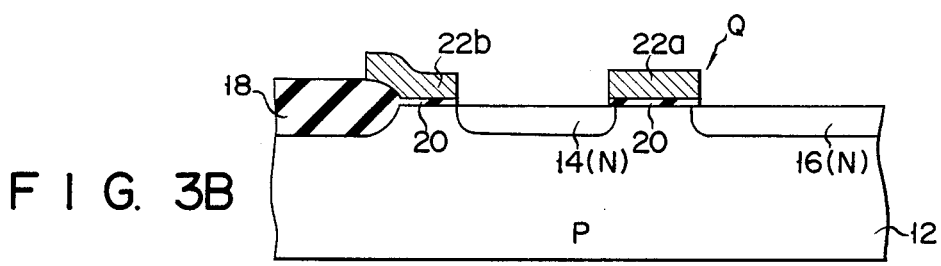

Subsequently, the insulative layer 20 of 12–25 nanometer thickness, serving as a gate oxide film, is formed through thermal oxidation on the substrate surface. The polycrystalline silicon film 22 is deposited on the layer 20. These layers 20 and 22 are subjected to patterning by simultaneous etching, thereby providing the gate electrodes 22a and 22b as shown in FIG. 3b. Then, an N type impurity is doped in the substrate 12 by, for example, ion implantation with gate electrodes 22a, 22b used as masks, and N type diffusion layers 14 and 16 are formed therein. These layers 14, 16 serve as the source and drain of the MOSFET Q (cell transistor). Through the above process, the MOS transistor Q of the memory cell is completed. It should be clear from FIG. 3B that the source and drain layers 14, 16 are substantially self-aligned with the gate electrode 22a. As clearly shown in FIG. 1, the gate electrode 22 continuously extends along an array of memory cells of DRAM in one direction and serves as a word line.

Figure 3C:
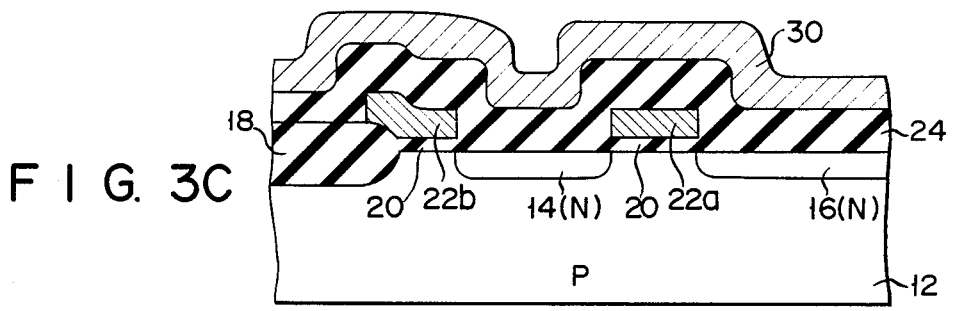
Figure 3D:
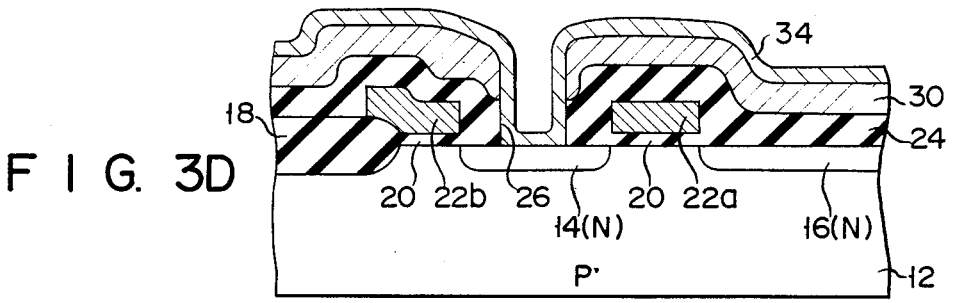

Then, as shown in FIG. 3C, the silicon oxide layer 24 is formed on the entire surface of the resultant structure by a CVD method. The silicon oxide layer 24 serves as an insulative layer to insulatively separate the cell MOS transistor Q from the overlying cell capacitor C. (This layer 24 is generally called "layer-insulation layer.") The first conductive layer 30 is deposited on the entire surface of this insulative layer 24. This conductive layer 30 may be a polycrystalline silicon layer of 300-nanometer thickness, for example. The first conductive layer 30 will serve as the lower electrode of the cell capacitor C.

Thereafter, known etching is carried out and the contact hole 26 is formed in the layers 24, 30. This contact hole 26 penetrates the layers 24, 30 and reaches the top surface of the substrate 12 where the source 14 is formed. The resultant structure is then subjected to noble hydrofluoric acid treatment, thereby depositing the second conductive layer 34 on the entire surface of the layer 30. The conductive layer 34 may be a polycrystalline silicon layer of 50-nanometer thickness, for example. The second conductive layer 34 is so thin that, as illustrated, it is uniformly stuck to the side walls and bottom of the contact hole 26. The second conductive layer 34 will also serve as the lower electrode of the cell capacitor C. Then, arsenic is doped in the substrate 12 by ion implantation under the implanting conditions that can realize about the same range of thickness as that of the polycrystalline silicon layer 34, for example, at an accelerating voltage of 60 kilo electron volts and with a dose of $1 \times 10^{16}/cm^2$.

Figure 3E:
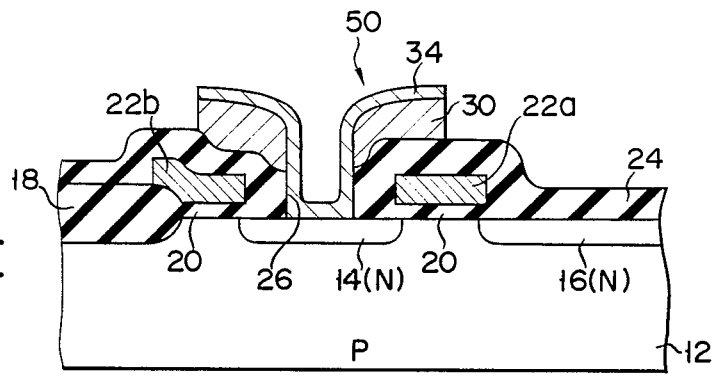
Figure 3F:
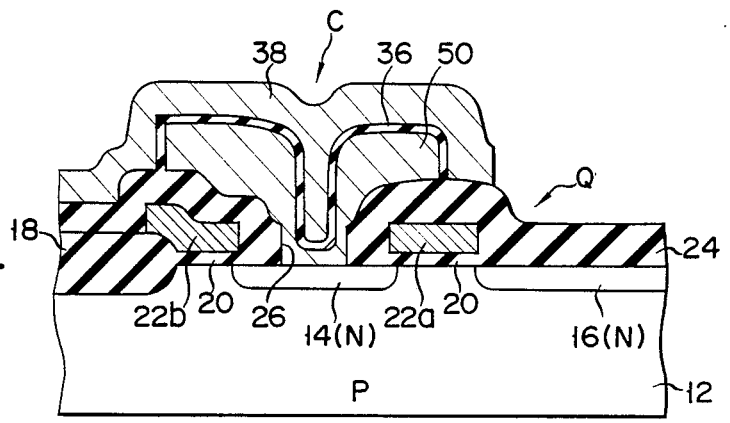

The first and second polycrystalline silicon layers 30, 34 are then subjected to patterning to thereby provide the lower capacitor electrode whose two edges partially overlap the electrodes 22a, 22b, as shown in FIG. 3E. The plane shape of the resultant structure is clearly illustrated in FIG. 1. The stacked structure of the lower capacitor electrode is designated by reference numeral "50" in FIG. 3E.

Subsequently, the thin insulative layer 36 serving as the capacitor insulation film is formed on the lower capacitor electrode 50. This insulative layer 36 may be a thermal oxide film, or, more preferably, a stacked layer of $Si_3N_4$ and $SiO_2$ films. The third conductive layer 38 is deposited on this layer 36, thus completing the cell capacitor C. The conductive layer 38 may be a polycrystalline silicon layer of 300-nanometer thickness, for example. This third conductive layer 38 serves as the upper electrode of the cell capacitor C.

After the silicon oxide layer 40 (see FIG. 2) is deposited by the CVD method on the entire surface of the resultant structure, the contact hole 28 is formed for the drain 16 of the MOS transistor Q. A noble hydrofluoric acid treatment is carried out to form the conductive layer 42 which is directly coupled to the drain 16 through the contact hole 28. The layer 42 is then subjected to patterning to provide a bit line intersecting the aforementioned word line layers 22a, 22b at right angles. Through the above process, a DRAM having the stacked capacitor cell structure as shown in FIGS. 1 and 2 is completed.

According to the above embodiment of the present invention, the lower electrode 50 of each cell capacitor C is constituted by the polycrystalline silicon layer 30, subjected to a process for simultaneously forming the layer-insulation layer 24 and contact hole 26, and the thin polycrystalline silicon layer 34 formed to be effectively fitted in the hole 26 after formation of the hole 26. With such an arrangement, even if the area of one cell region is reduced due to high integration of a DRAM, the effective area of the capacitor electrode can be increased to thereby increase the capacitance of the capacitor. For instance, as compared with the conventional capacitor structure provided under the same producing conditions, the capacitor structure of the present invention can easily increase the capacitance 1.3 to 1.4 times as great as the conventional type.

In addition, since the first polycrystalline silicon layer 30 serving as part of the lower electrode 50 of each cell capacitor C is formed prior to forming the contact hole 26 for the drain, this layer 30 serves as an etching-resistive protection layer of the underlying silicon oxide layer 24 in the noble hydrofluoric acid treatment performed after the formation of the contact hole 26. In the noble hydrofluoric acid treatment, therefore, the silicon oxide layer 24 can be effectively prevented, by the coverage of the polycrystalline silicon layer 30, from being undesirably etched. This can surely eliminate insulation breakdown that would otherwise generate electrical short-circuit between gate electrodes 22a and 22b through silicon oxide layer 24. This can significantly contribute to improvement of the operational reliability of DRAMs.

A modification of the above DRAM production method will be described below referring to FIGS. 4A through 4D, in which the same or like reference numerals are used to specify those identical or corresponding to the elements shown in FIGS. 3A to 3F, thus omitting their otherwise redundant detailed description only for descriptive simplification.

FIG. 4A illustrates the structure immediately before the process shown in FIG. 3C. In other words, it illustrates the cross section of the resultant structure immediately after only the silicon oxide layer 24 is deposited by the CVD method on the gate electrodes 22a, 22b. This silicon oxide layer 24 is then etched for approximately one minute by a buffer hydrofluoric acid solution. Through this process, the surface portion of the silicon oxide layer 24 is slightly etched out, making the top surface smoother.

In the subsequent step, a thin insulative layer 60 is deposited on the silicon oxide layer 24 by the CVD method, as shown in FIG. 4B. This insulative layer 60 may be a $Si_3N_4$ film of 20-nanometer thickness, for example. The first conductive layer 30 serving as the lower electrode of the cell capacitor C is then formed on the $Si_3N_4$ film 60.

Figure 4D:
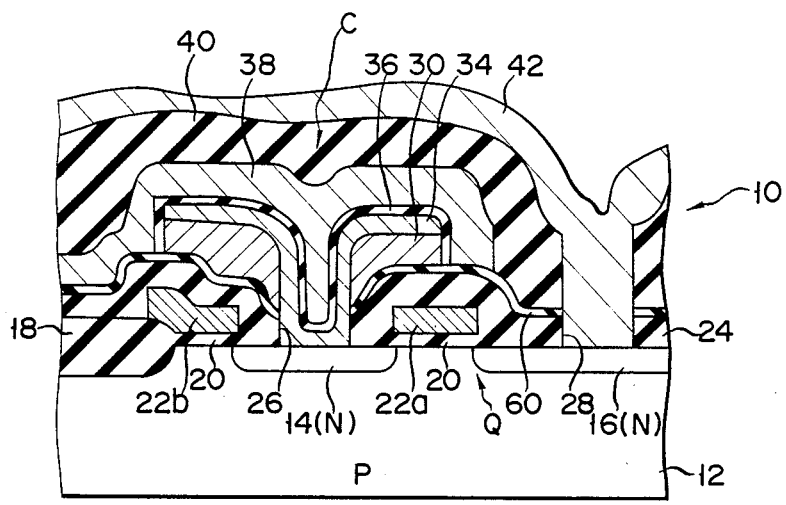

The subsequent manufacturing processes are basically similar to the fabrication procedures described above referring to FIGS. 3D through 3F. Though redundant in a way, these processes will be briefly described below for the purpose of memory refreshment. The layers 24, 60 and 30 are simultaneously subjected to etching process to form the contact hole 26 which penetrates these layers and reaches the source layer 14 of the cell MOS transistor Q, as shown in FIG. 4C. The second conductive layer 34 is formed on the resultant structure. The layers 30, 34 are then subjected to patterning to thereby define the stacked structure 50 of the capacitor lower electrode shown in FIG. 3E. Then, the capacitor upper electrode layer 38 is formed, thus completing the capacitor C. After the insulative layer 40 is deposited on the resultant structure, the layers 24, 60 and 40 are simultaneously subjected to etching so as to form the contact hole 28 which penetrate these layers and reaches the drain layer 16 of the cell MOS transistor Q, as shown in FIG. 4D.

In the DRAM produced by the above fabrication method, it is also possible to eliminate the insulation breakdown that would otherwise generate short-circuit between the lower capacitor electrode structure 50 and gate electrode 22 through silicon oxide layer 24 in each memory cell of the DRAM. This can significantly contribute to improvement of the operational reliability of DRAMs because the $Si_3N_4$ film 60 is formed prior to forming the contact hole 26 and serves as an etching-resistive protection layer of the underlying silicon oxide layer 24 in the noble hydrofluoric acid treatment performed after the formation of the contact hole 26.

Another embodiment of the present invention will be described below referring to FIGS. 5A through 5G, in which the same or like reference numerals are also used to specify those identical or corresponding to the elements shown in FIGS. 3 and 4, thus omitting their otherwise redundant detailed description only for descriptive simplification.

The structure shown in FIG. 5A in cross section substantially corresponds to the one shown in FIG. 3C. The insulative layer 24 and polycrystalline silicon layer 30, which will serve as part of the lower electrode of the cell capacitor, are subjected to etching to thereby form a contact hole 70 as shown in FIG. 5B. The N type diffusion layer 16 serving as a drain is partially exposed at the top surface through this contact hole 70.

The etching process for forming the contact hole 70 does not end at the time the N type diffusion layer 16 is exposed, but it continues the bottom 72 of the contact hole 70 gets deeper, penetrating the layer 16, to erode even the substrate 12. The depth of the hole 70 at the exposed surface portion may be approximately 1 micrometer, for example. Those layer portions of the diffusion layer 16 which are separated by the contact hole 70 are designated by reference numerals "16a" and "16b" in FIG. 5C.

Figure 5D:
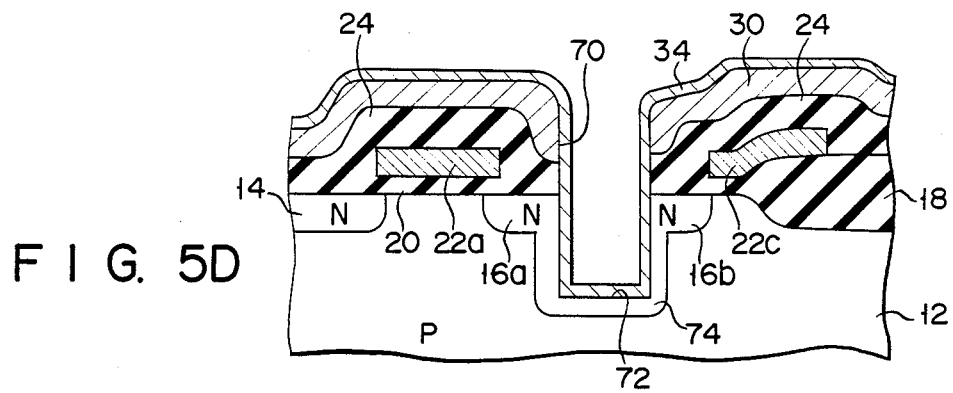

Subsequently, as shown in FIG. 5D, the polycrystalline silicon layer 34 as the second conductive layer is deposited on the entire surface of the layer 30 after noble hydrofluoric acid treatment in such a way as to be stuck to the side walls and bottom of the deep hole 70. Then, arsenic is doped in the entire region of substrate 12 by ion implantation After the substrate is subjected to heat treatment, an N type diffusion layer 74, which contacts the diffusion layer portions 16a, 16b and substantially evenly surrounds the bottom 72 of the contact hole 70, is formed relatively shallow in the substrate 12. These layers 16a, 16b and 74 thereafter become one integral diffusion layer.

Figure 5E:
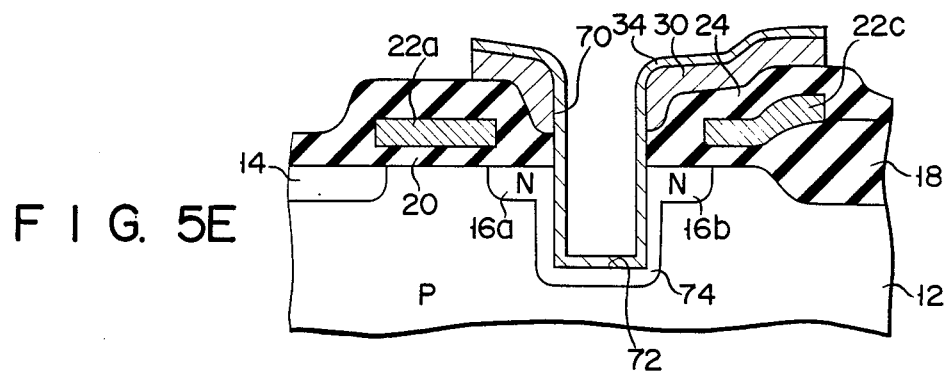
Figure 5F:
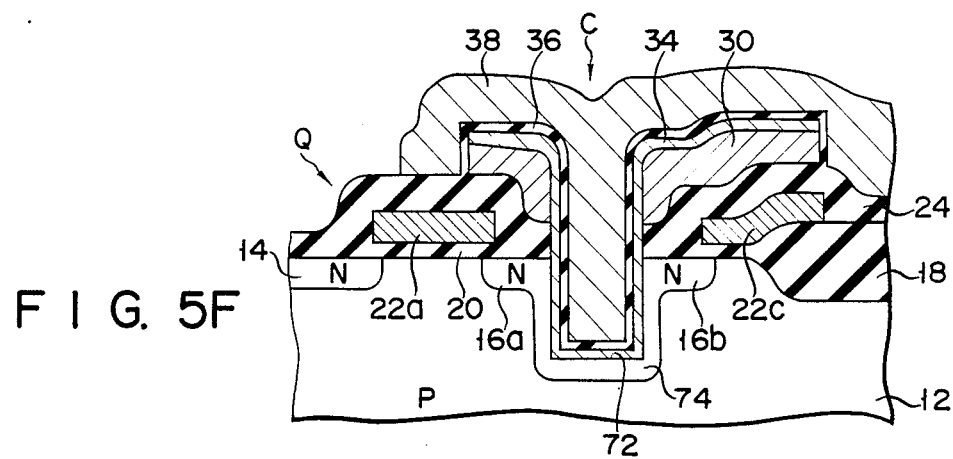
Figure 5G:
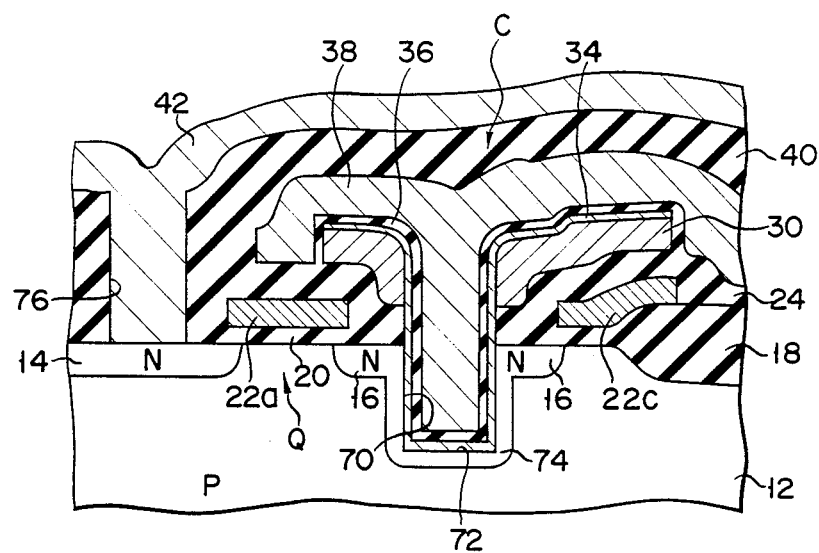

In the subsequent step, the layers 30, 34 are subjected to patterning to provide the stacked structure of the lower capacitor electrode, as shown in FIG. 5E. Then, as shown in FIG. 5F, the insulative thin film 36 serving as the capacitor insulative layer is formed on the resultant structure, and the third polycrystalline silicon layer 38 serving as the upper capacitor electrode is formed on the thin film 36. Through the above process, the stacked capacitor C is completed. The subsequent manufacturing processes are basically similar to the fabrication procedures described previously: after formation of the insulative layer 40 that entirely covers the resultant structure, a contact hole 76 is defined by the insulative layers 20, 24, 40, as shown in FIG. 5G. After executing noble hydrofluoric acid treatment, the conductive layer 42 is formed, which is directly coupled to the diffusion layer 14 via the contact hole 76. The layer 42 is subjected to patterning to provide a bit line intersecting the aforementioned word line layers 22a, 22b at the right angles. At this stage, the DRAM having the stacked capacitor cell structure according to the third embodiment of the present invention is completed.

Since the opening 70 serving as capacitor groove is formed deep so as to bore even the surface portion of the substrate 12, the above arrangement can produce an additional effect such that the effective capacitor electrode area can be increased without increasing the capacity-occupying area. The formation of the recess at the substrate surface contributes to reducing the electric contact between the N type diffusion layer 74 and the underlying electrode of the capacitor C. Particularly, since the N type diffusion layer 74 formed on the substrate 12 to surround this recess is formed by solid phase diffusion from the polycrystalline silicon layer which serves as the lower capacitor electrode, the depth and/or the impurity concentration of the diffusion layer 74 can be well controlled to form this diffusion layer at the proper shallowness. This can suppress or prevent deterioration of the transistor characteristic and a current leak between adjoining memory cells.

Although the invention has been described with reference to specific embodiments, it shall be understood by those skilled in the art that numerous modifications may be made that are within the spirit and scope of the invention

What is claimed is:

1. A semiconductor memory device with a stacked capacitor cell structure, comprising:
a semiconductive substrate;
a memory cell, provided on said substrate and having a transistor, a capacitor and an insulative layer formed on said substrate so as to have an opening, and positioned between said transistor and said capacitor,
said transistor having first and second semiconductive active layers formed in said substrate and an electrode layer insulatively deposited above said substrate,
the improvement where said capacitor comprises:
(a) a first conductive layer formed on said insulative layer and around said opening, said first conductive layer having an opening formed continuous with said opening of said insulative layer to thereby define a contact hole coupled to one of said active layers;
(b) a second conductive layer formed on said first conductive layer in such a way as to cover an inner wall of said contact hole and that surface portion of one of said active layers which is exposed through said contact hole, said second conductive layer having a recess corresponding to said contact hole, said first and second conductive layers constituting a first electrode of said capacitor;
(c) an insulative thin film formed on said second conductive layer and serving as a capacitor insulative layer; and
(d) a third conductive layer formed on said insulative thin film so as to cover said recess of said second conductive layer, said third conductive layer constituting a second electrode of said capacitor.

2. The device according to claim 1, wherein said substrate has a recess continuous with said contact hole and having a bottom portion and said second conductive layer is in direct contact with said bottom portion.

3. The device according to claim 2, wherein said one of said active layers comprises:
a first diffusion layer formed in a surface of said substrate; and
a second diffusion layer overlapping said first diffusion layer, formed to surround said recess of said substrate.

4. The device according to claim 3, wherein said electrode layer of said transistor serves as a gate electrode and said active layers serve as a source and a drain thereof, thereby constituting a metal-oxide-semiconductor field effect transistor.

5. The device according to claim 4, further comprising:
(e) a second insulative layer covering said capacitor, said insulative layers having a second opening serving as a contact hole for the other of said active layers; and
(f) a fourth conductive layer formed on said second insulative layer and electrically coupled to the other of said active layers through said second opening.

6. The device according to claim 5, wherein said gate electrode of said transistor and said fourth conductive layer extend thin and long so as to be intersect each other at substantially right angles, whereby said gate electrode serves as a word line of said device and said fourth conductive layer serves as a bit line of said device.

7. A method of manufacturing a semiconductor memory device having a stacked capacitor cell structure, said method comprising the steps of:
(a) forming a transistor of a memory cell on a semiconductor substrate, said transistor having first and second semiconductive active layers formed in said substrate and an electrode layer insulatively disposed above said substrate;
(b) forming an insulative layer so as to cover said transistor;
(c) forming a first conductive layer on said insulative layer;
(d) forming an opening in said insulative layer and said first conductive layer by an etching process in such a way as to partially expose a surface of one of said active layers;
(e) forming a second conductive layer on said first conductive layer in such a way as to cover an inner wall of said opening and said exposed surface portion of said one of said active layers, said second conductive layer having a recess corresponding to a contact hole;

(f) subjecting said first and second conductive layers to patterning to thereby define a first electrode of a capacitor;

(g) forming an insulative thin film on said second conductive layer and serving as a capacitor insulative layer; and (h) forming a third conductive layer on said insulative thin film in such a way as to cover said recess of said second conductive layer, said third conductive layer constituting a second electrode of said capacitor to thereby provide a capacitor of said memory cell.

8. The method according to claim 7, wherein said etching process continues until said substrate is etched to thereby have a recess continuous with said opening at said exposed surface portion of said one of said active layers.

9. The method according to claim 8, wherein sad one of said active layers is partially removed by formation of said recess of said substrate, and wherein after forming said second conductive layer, an impurity is doped in said substrate to thereby form in said substrate a semiconductive layer which surrounds said recess of said substrate and is in contact with the remaining layer portion of said one of said active layers.

10. The method according to claim 7, wherein a second insulative layer is formed on said insulative layer prior to forming said first conductive layer, said first conductive layer is formed on said second insulative layer, and said insulative layers and said first conductive layer are simultaneously subjected to said etching process.

11. A capacitor structure comprising:
a semiconductor base layer;
an insulative layer formed on said base layer and having a first opening;
a first conductive layer formed on said insulative layer and around said first opening, said first conductive layer having a second opening;
a second conductive layer formed on said first conductive layer so as to cover an inner wall of said first and second openings and to cover a surface portion of said base layer which is exposed through said first and second openings, said second conductive layer having a recessed surface in said second opening; and
a third conductive layer insulatively disposed above said second conductive layer and having a layer portion which is positioned in said first and second openings and which has a surface facing said recessed surface of said second conductive layer.

12. The structure according to claim 11, wherein said first and second openings are continuous with each other to define a contact hole.

13. The structure according to claim 12, further comprising:

an insulative thin film sandwiched between said second conductive layer and said third conductive layer and having a substantially uniform thickness.

14. The structure according to claim 12, wherein said base layer includes a substrate.

15. The structure according to claim 14, wherein said first and second conductive layers serve as one electrode of said capacitor structure whereas said third conductive layer serves as the other electrode of said capacitor structure.

16. The structure according to claim 15, wherein said substrate has a recess continuous with said contact hole and having a bottom portion and said second conductive layer is in direct contact with said bottom portion.

17. The structure according to claim 16, wherein said first to third conductive layers are made of a polycrystalline semiconductive material.

18. The structure according to claim 17, wherein said first and second conductive layers have edge portions self-aligned on said insulative layer, and wherein said third conductive layer extends over said insulative layer so as to cover said edge portions of said first and second conductive layers.

19. The structure according to claim 18, wherein said first to third conductive layers are made of a polycrystalline semiconductive material.

20. The structure according to claim 19, wherein said first and second conductive layers have a rectangular plane shape and said contact hole is located substantially at a center of said rectangular plane shape.

21. The structure according to claim 20, wherein said contact hole has a rectangular plane shape.

22. A capacitor structure comprising:
a semiconductor base layer;
an insulative layer formed on said base layer and having an opening;
a first conductive layer formed on said insulative layer and around said opening, said first layer having an opening;
a second conductive layer formed on said first layer so as to cover an inner wall of the openings and that surface porton of said base layer which is exposed through said openings, said second layer having a recessed surface in said openings, said first and second layers having peripheral edges; and
an insulative thin film formed on said second layers;
a third conductive layer formed on said thin film and having a layer portion which is positioned in said openings and which has a surface facing said recessed surface of said second layer.

23. The structure according to claim 22, wherein said peripheral edges of said first and second layers are substantially self-aligned with each other.

24. The structure according to claim 23, wherein said first and second openings are continuous with each other to define a contact hole.

25. The structure according to claim 24, wherein said first and second layers serves as the other capacitor electrode.

26. The structure according to claim 24, wherein said base layer includes a semiconductor substrate.

* * * * *